(12) United States Patent
Yokogawa et al.

(10) Patent No.: US 7,771,564 B2
(45) Date of Patent: Aug. 10, 2010

(54) PLASMA PROCESSING APPARATUS

(75) Inventors: Ken'etsu Yokogawa, Tsurugashima (JP); Takumi Tandou, Asaka (JP); Seiichiro Kanno, Kodaira (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/512,081

(22) Filed: Aug. 30, 2006

(65) Prior Publication Data
US 2008/0023147 A1 Jan. 31, 2008

(30) Foreign Application Priority Data
Jul. 26, 2006 (JP) ............................. 2006-202715

(51) Int. Cl.
H01L 21/3065 (2006.01)
C23C 16/00 (2006.01)
C23C 16/458 (2006.01)
C23C 16/46 (2006.01)

(52) U.S. Cl. .................. 156/345.53; 118/715; 118/725; 118/728

(58) Field of Classification Search ................ 118/724, 118/728, 715, 725, 729, 730; 156/345.53; 11/724, 728
See application file for complete search history.

(56) References Cited

U.S. PATENT DOCUMENTS

| | | | | |
|---|---|---|---|---|
| 5,085,750 A | * | 2/1992 | Soraoka et al. | 204/192.32 |
| 5,267,607 A | * | 12/1993 | Wada | 165/80.1 |
| 5,427,670 A | * | 6/1995 | Baggerman et al. | 204/298.09 |
| 5,748,435 A | * | 5/1998 | Parkhe | 361/234 |
| 5,935,396 A | * | 8/1999 | Buckfeller et al. | 204/298.09 |
| 6,450,805 B1 | * | 9/2002 | Oda et al. | 432/247 |
| 6,471,779 B1 | * | 10/2002 | Nishio et al. | 118/724 |
| 6,474,986 B2 | * | 11/2002 | Oda et al. | 432/247 |
| 6,506,291 B2 | * | 1/2003 | Tsai et al. | 204/298.15 |
| 6,581,275 B2 | * | 6/2003 | Narendrnath et al. | 29/825 |
| 6,729,261 B2 | * | 5/2004 | Hongo | 118/723 MW |
| 6,853,533 B2 | * | 2/2005 | Parkhe | 361/234 |
| 6,887,315 B2 | * | 5/2005 | Lim et al. | 118/715 |
| 7,347,901 B2 | * | 3/2008 | Fink et al. | 118/724 |
| 2002/0137334 A1 | * | 9/2002 | Watanabe et al. | 438/677 |
| 2003/0168174 A1 | * | 9/2003 | Foree | 156/345.51 |
| 2004/0115947 A1 | * | 6/2004 | Fink et al. | 438/716 |
| 2005/0045104 A1 | * | 3/2005 | Arai et al. | 118/724 |
| 2006/0137822 A1 | * | 6/2006 | Cowans | 156/345.51 |
| 2008/0023147 A1 | * | 1/2008 | Yokogawa et al. | 156/345.53 |

FOREIGN PATENT DOCUMENTS

JP  2005-89864  4/2005

* cited by examiner

*Primary Examiner*—Jeffrie R Lund
(74) *Attorney, Agent, or Firm*—Antonelli, Terry, Stout & Kraus, LLP.

(57) ABSTRACT

In a plasma processing apparatus equipped with a vacuum vessel and a sample table which is arranged within the vacuum vessel and has a sample mounting plane where a sample is mounted on an upper portion, for forming plasma within the processing chamber so as to process a sample mounted on the sample mounting plane, the plasma processing apparatus includes: a space arranged inside the sample table, into which a coolant is supplied; a ceiling plane of the space arranged opposite to the sample mounting plane, with which the coolant collides from plural portions; and an exhaust port via which the coolant which has collided with the ceiling plane to be evaporated is exhausted from the sample table.

6 Claims, 7 Drawing Sheets

SECTIONAL VIEW OF LINE A-A'

PLASMA PROCESSING APPARATUS

BACKGROUND OF THE INVENTION

The present invention generally relates to an apparatus for processing a sample used to manufacture a semiconductor device. More specifically, the present invention is directed to an apparatus capable of performing either an etching process operation or a film forming process operation in a high efficiency and in high precision with respect to various sorts of films such as a silicon film and a silicon oxide film, which are formed on a semiconductor wafer surface having a substrate shape, while the semiconductor wafer corresponds to a sample which should be processed by using plasma.

As typical example as to the previously explained processing apparatus used to manufacture semiconductor devices, the below-mentioned plasma etching apparatus have been provided. That is, while resists are employed as masks which have been patterned on substrates such as semiconductor wafers by way of lithography techniques, films such as silicon films and silicon oxide films which have been formed on upper planes of these substrates and constitute structural materials of semiconductor devices are plasma-processed by using plasma generated in processing chambers which are arranged in the plasma etching apparatus under high vacuum condition. In plasma etching processes executed in such apparatus, processing gas induced into the processing chambers arranged in the vacuum vessels is processed by electric fields processed by the supplied high frequency electric power so as to generate plasma; and surfaces of substrates corresponding to sample to be processed are exposed by the generated plasma, so that films of the samples to be processed are etching-processed on the substrates.

When this etching process is carried out, since high frequency electric power is supplied to a lower electrode arranged within a sample table on which a sample corresponding to a material to be processed is mounted on this upper plane, a potential is formed also on this sample by the high frequency electric power, charged particles contained in plasma are induced to the surface side of the sample so as to increase a processing efficiency, so that a high speed processing operation can be carried out. In this case, while the above-explained sample is being exposed by the plasma, the high frequency electric power is further applied to the lower electrode, so that the sample is heated. On the other hand, a processed shape of a surface of a sample and an etching process characteristic such as an etching speed are largely influenced by temperatures (temperatures of film surface of process subject) on this sample surface. As a result, in order to achieve a desirable etching processed subject, surface temperatures of the processing subject must be controlled within proper temperature ranges. Accordingly, a sample mounting unit for mounting thereon samples have been mounted on the above-described conventional processing apparatus, for example, a unit for controlling temperatures of samples (e.g., samples are cooled) have been provided within sample tables.

In particular, in an etching process operation of insulating films which are typically known as a silicon oxide film, generally speaking, higher electric power is applied to a lower electrode, as compared with electric power used in the case that gate films such as a metal film and a silicon film are etched. For example, such an electric power higher than, or equal to 1.5 W/cm$^2$ per a unit area of a sample is applied to the lower electrode. Furthermore, very recently, in order to realize processing operations in higher speeds, high frequency electric power higher than, or equal to 10 W/cm$^2$ is required to be applied. In such a case that the above-described higher electric power is applied to either the lower electrode or the sample, such a cooling unit capable of cooling either a sample table or a wafer in a higher efficiency is required. As a cooling unit meeting this requirement, the following technical idea may be conceived. That is, either the sample table or the sample may be cooled by a refrigerating cycle which contains a coolant path within the sample table, and is constituted by using a compressor, a condenser, an expansion valve in addition to this coolant path.

As this conventional technical idea, such a system is disclosed in JP-A-2005-089864. This conventional technique discloses that while a path through which a heat exchanging medium (coolant) flows is arranged inside a sample table for mounting a sample within a processing chamber and this path corresponds to such path for constituting a refrigerating cycle, the coolant is evaporated within this path and is directly expanded to emit latent heat. As a result, the expanded coolant performs a heat exchange with the sample table and the sample mounted on this sample table in order to cool the temperature of the sample table and the temperature of the sample. In other words, in this conventional technique, either the sample table or the path for the coolant within the sample table may function as an evaporator which is equal to a heat exchanger of the refrigerating cycle.

SUMMARY OF THE INVENTION

In the above-explained conventional processing system with employment of a so-called "direct expansion type refrigerating cycle" in which the coolant is directly expanded inside the sample table so as to cool the sample table (disclosed in JP-A-2005-089864), either the sample or the sample table is cooled by heat of vaporization caused by evaporating the cooling coolant within the sample table corresponding to the unit for mounting the sample. As a result, the higher cooling efficiency can be realized, as compared with the cooling efficiency achieved in such a cooling apparatus that a heat exchanging medium flowing through a path within a sample table is heat-exchanged with another cooling unit on the outer side. However, in the above-described conventional technique, an amount ratio of coolants under liquid state to coolants under vapor state within the coolant path within the sample table is varied between the entrance side of this path and the exit side thereof. In other words, the amount of the coolants under vapor state on the exit side of the path becomes larger than the amount of the coolants under vapor state on the entrance side of this path, because the coolants are heat-exchanged within the path and thus are vaporized.

As a consequence, there is such a difference between the cooling efficiencies, which is caused by the difference in the amounts of the coolants which are heat-exchanged on the entrance side of the path and the exit side thereof. Therefore, the above-explained conventional technique cannot pay sufficiently deep consideration as to such a problem that a temperature difference is produced within a plane of a sample such as a semiconductor wafer which is mounted on the sample table so as to be cooled. Under such a circumstance, the above-explained conventional technique cannot pay sufficiently deep consideration as to such a problem that if a temperature difference is produced within the plane of the sample, then a internal plane difference is produced in a plasma etching characteristic, and thus, shapes obtained in the plasma process operation become uniform on the plane of the sample.

An object of the present invention is to provide a plasma processing apparatus capable of suppressing a temperature difference produced within a plane of a sample under process, and capable of improving a uniformity of the process operation.

The above-described object is achieved by such a plasma processing apparatus equipped with a vacuum vessel and a sample table which is arranged within the vacuum vessel and has a sample mounting plane where a sample is mounted on an upper portion, for forming plasma within the processing chamber so as to process a sample mounted on the sample mounting plane, including: a space arranged inside the sample table, into which a coolant is supplied; a ceiling plane of the space arranged opposite to the sample mounting plane, with which the coolant collides from plural portions; and an exhaust port via which the coolant which has collided with the ceiling plane to be evaporated is exhausted from the sample table.

Further, the above-described object may be achieved by that the coolant supplied to the space within the sample table collides with the ceiling plane to be dispersed, and thereafter, the dispersed coolant is exhausted from the exhaust port. In addition, the object may be achieved by further including: another space which is arranged within the sample table below the space with which the coolant collides to be dispersed, and to which the coolant is supplied and is diffused therein; and a plurality of coolant conducting holes which are arranged at the plural portions, and are communicated with the another space and the space for dispersing the coolant, thorough which the coolant flows out toward the ceiling plane.

Furthermore, the object may be achieved by further including: a plurality of concave portions which are arranged in the ceiling plane and into which the coolant is induced. In addition, the object may be achieved by that the coolants supplied from the plural portions are directly induced into internal portions of the concave portions.

Moreover, the object may be achieved by that the plurality of concave portions are constituted by a plurality of grooves which are elongated in a radial form from a center side of the sample table to an outer circumferential side thereof. Moreover, the object may be achieved by that the groove elongated in the radial form has such a shape that a width thereof on the outer circumferential side of the sample table is wider than a width thereof on the center side of the sample table, and the coolant supplied to the groove is moved from the center side of the sample table toward the outer circumferential side.

Moreover, the object may be achieved by further including: a ring-shaped space which is arranged on the outer circumferential side of the space in which the coolant collides with the ceiling plane, into which the heat-exchanged coolant flows, and thereafter, the entered coolant is exhausted toward an external portion of the sample table. Moreover, the object may be achieved by further including: a supply path for supplying heat transfer gas between the sample mounting plane and the sample mounted on the sample mounting plane. Moreover, the object may be achieved by further including: a compressor for compressing the coolant exhausted to the external portion after the coolant has been heat-exchanged within the sample table; and a condenser for condensing the coolant derived from the compressor; in which the plasma processing apparatus is provided with a refrigerating cycle equipped with the sample table as an evaporator in which the coolant exhausted from the condenser is evaporated.

In the present invention, while the sample table corresponding to the sample setting unit is employed as the evaporator of the direct expansion type refrigerating cycle, in the plasma processing apparatus for cooling the sample mounted on this sample table, the difference within the cooling planes is suppressed which is caused by the cooling coolant states occurred in the coolant entrance port and the coolant exit port within the sample table, so that either the cooling efficiency or the processing uniformity can be improved.

Other objects, features and advantages of the invention will become apparent from the following description of the embodiments of the invention taken in conjunction with the accompanying drawings.

DETAILED DESCRIPTION OF THE INVENTION

Referring now to drawings, various embodiments of the present invention will be described in detail.

Embodiment 1

Figure 1:
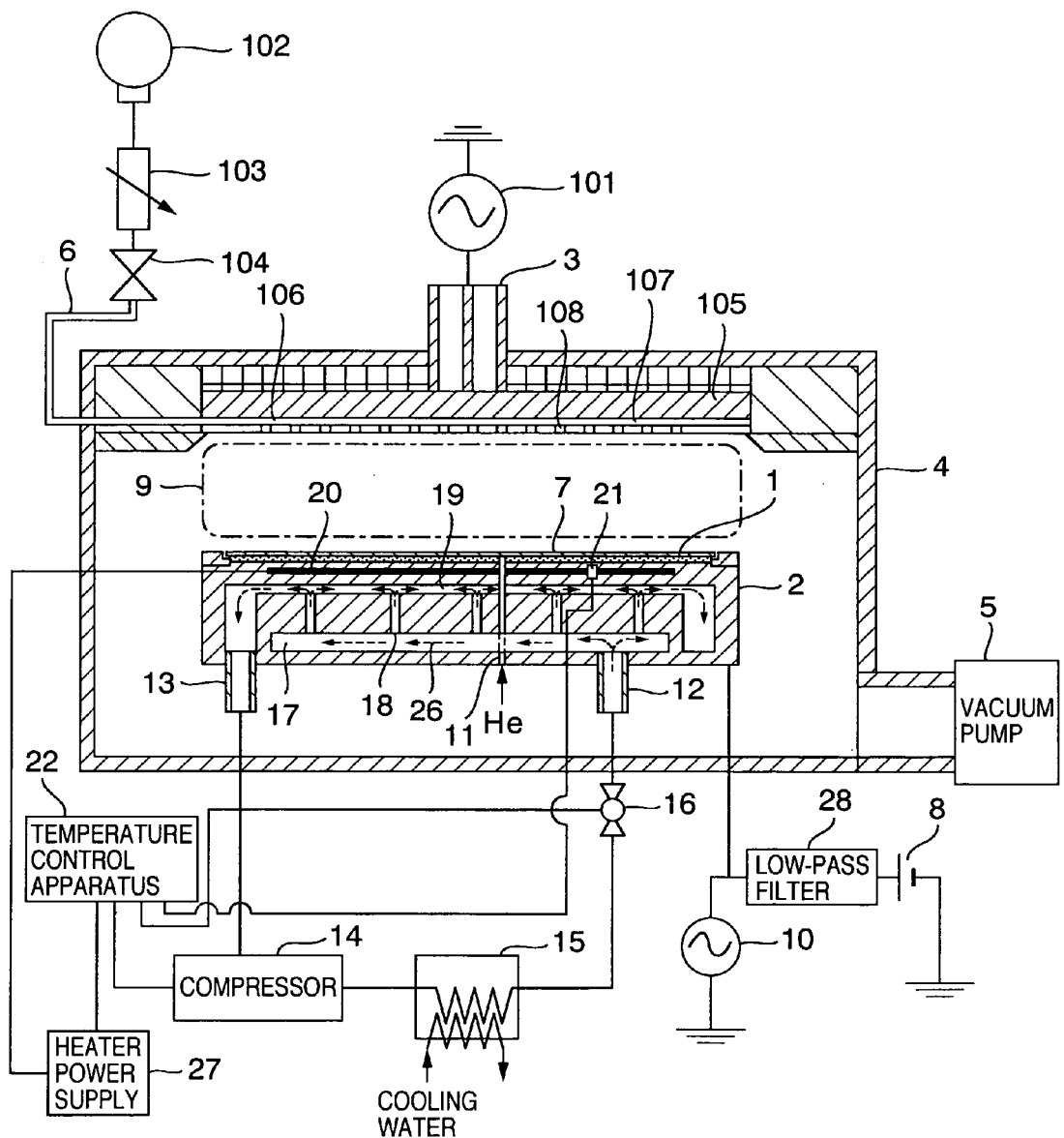
FIG. 1 is a longitudinal sectional view for schematically showing an arrangement of a plasma processing apparatus according to an embodiment of the present invention.
Figure 2:
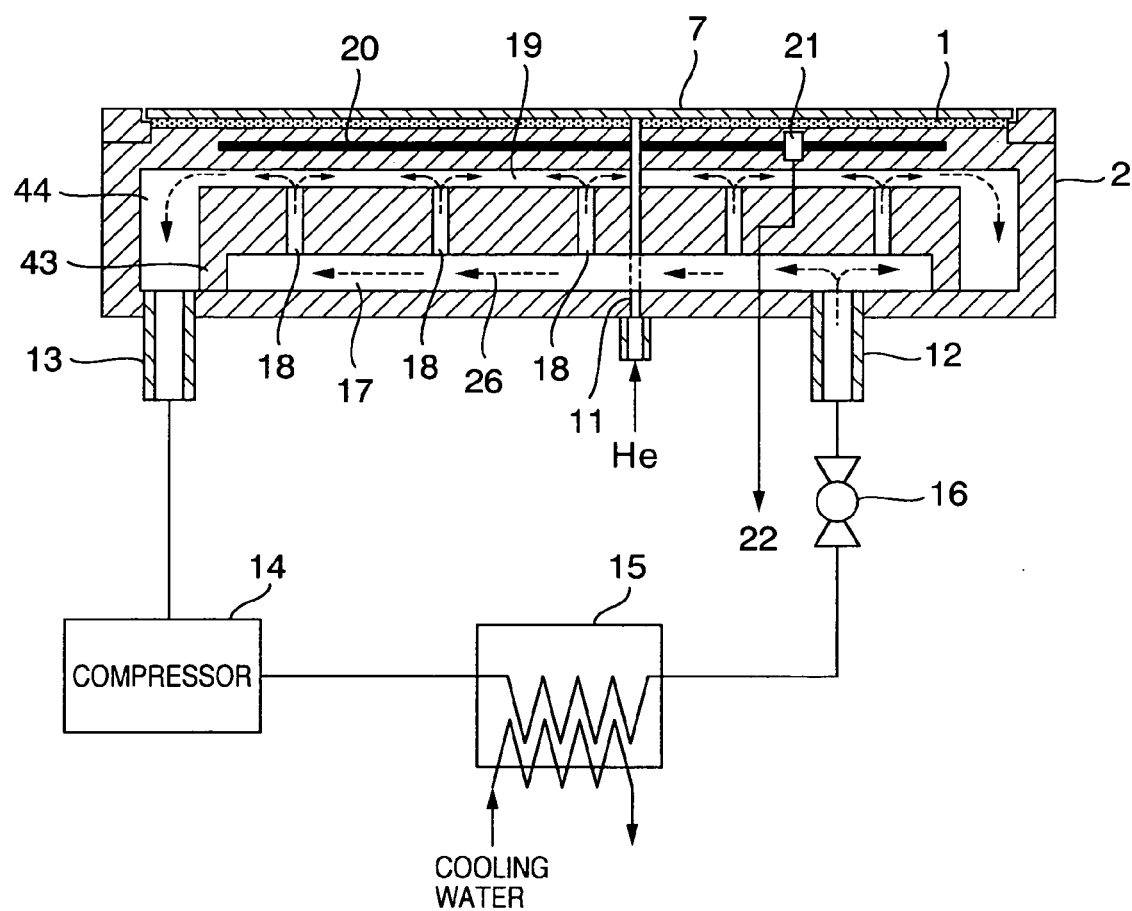
FIG. 2 is a schematic diagram for representing more in detail, an arrangement in the vicinity of a sample table of the plasma processing apparatus shown in FIG. 1.

FIG. 1 and FIG. 2 show a plasma processing apparatus of an embodiment 1 of the present invention. FIG. 1 is a longitudinal sectional view for schematically showing an arrangement of a plasma processing apparatus according to an embodiment of the present invention. FIG. 2 is a schematic diagram for representing more in detail, an arrangement in the vicinity of a sample table of the plasma processing apparatus shown in FIG. 1. In this sample table of FIG. 2, there are shown: an internal construction of a sample table 2 having an insulator film 1 on an upper plane thereof, and a construction of a refrigerating cycle in which this sample table 2 is used as an evaporator.

The plasma processing apparatus shown in FIG. 1 is equipped with the sample table 2, an electric field supplying unit 3, a vacuum pump 5, and a gas conducting path 6. The sample table 2 is shown in FIG. 2 and is arranged within a processing chamber which corresponds to a space within a vacuum vessel. The electric field supplying unit 3 is used to apply an electric field within the processing chamber, and contains an antenna. The vacuum pump 5 is used to exhaust vapor such as particles and gas of produced articles within the processing chamber. The gas conducting path 6 is used to conduct process gas into a space located above the sample table 2 of the processing chamber.

The gas conducting path 6 is coupled via both a valve 104 and a flow rate controller 103 such as mass flow controller (MFC) to a gas source 102. Processing glass supplied from the gas source 102, the flow rate of which has been controlled by the flow rate controller 103, is induced from a plurality of through holes 108 having very small diameters via the gas conducting path 6 to the space located above the sample table 2. The plurality of through holes 108 are arranged in a disk-shaped shower plate 107. This disk-shaped shower plate 107 is made of an electric conductive material such as silicon, and constitutes a ceiling plane of the processing chamber located above the sample table 2 within the processing chamber, and also is arranged in such a manner that an entire portion of a sample 7 is covered by the shower plate 107 above this sample 7.

The plural through holes 108 are substantially uniformly arranged over a sample mounting plane of the sample table 2 above this sample mounting plane. Also, the gas flow flowing through the gas conducting path 6 is induced to a space 106 elongated along a plane direction of the disk-shaped conductive member. The space 106 corresponds to such a space defined between the shower plate 108 located within the vacuum chamber 4, and a lower plane of an antenna 105. The antenna 105 is arranged opposite to the sample mounting plate above the sample table 2 within the vacuum vessel 4, and is constituted by the disk-shaped conductive member which constitutes the electric field supplying unit 3. The above-explained gas is dispersed within the space 206 along the plane direction, and then, the dispersed gas is substantially uniformly entered from the plural through holes 108 to the direction (lower direction) of the sample mounting plate.

Process gas induced inside the processing chamber becomes plasma 9 by way of an electric field, so that a predetermined process operation, for example, an etching process operation is carried out with respect to the sample 7 mounted on an upper plane of the sample table 2. The electric field applied to the processing chamber from the antenna 105 to which electric power is supplied from an electromagnetic wave source 101, while the electromagnetic wave source 101 is coupled to the electric field supplying unit 3 and supplies a high frequency electromagnetic wave in a specific frequency band, for instance, a UHF band and a VHF band. It should be noted that a member made of an insulator such as quartz has been filled between the antenna 105 and the vacuum vessel 4 and is arranged in such a manner that this insulating member surrounds outer peripheral portions of the upper portion and the side portion of the antenna 105.

Particles such as reactive produced particles which are produced within the processing chamber in connection with the processing operation such as the above-explained etching process operation, and particles such as ions and electrons contained in the above-explained process gas and the plasma 9 are moved from the spaces around the outer peripheral portions of the sample table 2 to the lower portion of the sample table 2 by operating the vacuum pump 5 so as to be exhausted via the vacuum pump 5. As a result, pressure within the processing chamber is maintained in a predetermined higher vacuum degree.

After the substrate-shaped sample 7 such as a semiconductor wafer which should be processed within the processing chamber has been mounted on an insulating film 1 corresponding to the sample mounting plane of the upper plane of the sample table 2, the mounted sample 7 is electrostatically chucked by an electrostatic field. The electrostatic field is produced by a DC voltage applied from the DC power supply 8 to an electrode which is constituted by an electric conductive member arranged within the sample table 2. It should also be noted that the electrode used to electrostatically absorb the sample 7 within the sample table 2 may be realized by such an electrode arranged as a thin film within the insulating film 1.

The high frequency electric power has also be applied from the high frequency power supply 10 to the electrode made of the electric conductive member within the sample table 2. Ions corresponding to charged particles contained in the plasma 9 are accelerated by a high frequency voltage which is produced on a surface of the sample 7 by this high frequency electric power, and then, the accelerated ions are entered into the surface of the sample 7, so that reaction of an etching process operation is progressed, and thus, the etching process operation can be carried out in a high efficiency. A major portion of energy of the high frequency power applied to the sample 7 via this sample table 2 finally constitutes thermal energy which heats the sample 7. On the other hand, a shape of the sample 7 which is obtained by the above-explained etching process operation may be largely influenced by a temperature of a surface which is processed. As a result, in order to process the sample 7 in high precision, the temperature of the sample 7 must be controlled in high precision. In this embodiment 1, the plasma processing apparatus is equipped with such a construction for controlling (cooling) a temperature of the sample 7 by way of the sample table 2.

Next, a construction of cooling the sample 7 will now be described. In the embodiment 1, helium gas having predetermined pressure has been induced via the conducting path 11 between the sample 7 and the insulating film 1. While this helium gas has been filled into a space between the sample 7 electrostatically chucked by the upper plane of the insulating film 11, and the upper plane of the insulating film 1 corresponding to the sample mounting plane, a heat transfer operation is performed between the sample 7 and the sample table 2 by way of a heat transfer operation of this helium gas. On the other hand, while a path through which a coolant is circulated is provided in the sample table 2, the sample table 2 is cooled by a heat exchange by the coolant.

A lower portion of the sample table 2 in this embodiment 1 is provided with a coolant conducting entrance port 12, and a coolant flow out port 13. The coolant conducting entrance port 12 is used to conduct the coolant to the coolant flow path within the sample table 2. This coolant is evaporated by heat transferred from the sample 7, and thus, the heat exchange is performed between the coolant and the sample table 2, and thereafter, the coolant flows out from the coolant flow out port 13. In this embodiment 1, the coolant induced inside the sample table 2 is vaporized by receiving the heat transferred from the sample 7, so that this vaporated coolant absorbs latent heat so as to perform the heat exchange. As a result, cooling of the sample table 2, eventually cooling of the sample 7 is carried out.

As a consequence, as indicated in FIG. 2, the sample table 2 constitutes one refrigerating cycle for circulating the coolant. This refrigerating cycle constructs a direct expansion type refrigerating cycle in which while the sample table 2 is employed as an evaporator, this evaporator is coupled via pipe paths of the coolant to a compressor 14, a condenser 15, and expansion valve 116, and the like, which are shown in FIG. 2.

That is, the direct expansion type refrigerating cycle contains these units as structural elements. In such a refrigerating cycle, the heat entered from the sample 7 is directly exhausted as heat of vaporization from the sample table 2, so that a high cooling efficiency can be realized. Due to this high cooling efficiency, even in such a case that high electric power is applied to the sample 7, such a cooling effect capable of controlling a temperature of the sample 7 in high precision within a desirable range can be achieved. The high electric power is defined higher than, or equal to 3 $W/cm^2$ per unit area.

However, since the above-described temperature control operation by such a refrigerating cycle corresponds to a system for removing heat due to vaporization of a coolant, a ratio of an amount of a coolant under fluid state to an amount of a coolant under vapor state in the vicinity of the coolant conducting entrance port 12 through which the coolant enters into the sample table 2 is different from that in the vicinity of the coolant flow out port 13 from which the heat-exchanged coolant is exhausted. Accordingly, in the vicinity of the coolant flow out port 13 where the amount of the heat-exchanged coolant is large, the ratio of the coolant under vapor state to the coolant under fluid state becomes larger than that in the coolant conducting entrance port 12. Under such a condition, there are the following problems: That is, a difference occurs between a cooling efficiency of the sample table 2 in the vicinity of the coolant conducting entrance port 12 and a cooling efficiency of the sample table 2 in the vicinity of the coolant flow out port 13, so that a temperature difference is produced within the plane of the sample 7. In the embodiment 1, in order to solve the above-described problems, the plasma processing apparatus is featured by using such a construction of the sample table 2 as shown in FIG. 2. That is to say, an internal portion of the sample table 2 shown in FIG. 2 has such a construction that a plurality of layers are formed along an upper/lower direction. In other words, the path through which the coolant entered from the coolant conducting port 12 and the members which constitute the path constitute the plural layers along the upper/lower direction within the sample table 2. The coolant induced into the sample table 2 flows into a first space located on the center side of the sample table 2, and thereafter, this coolant flows into a second space which corresponds to such a space located above the first space and is elongated to the outer circumferential side while the second space covers the first space, and then is moved to the outer circumferential side thereof (namely, outer circumferential side of sample table 2). The coolant moved to the outer circumferential side is exhausted from the coolant flow out port 13 which is arranged on the lower plane of the outer circumferential side.

A substantially cylindrical-shaped space having a center which is substantially coincident with a center axis of the sample table 2 is arranged inside of the sample table 2 having a substantially cylindrical shape; a substantially circular plane having a coaxial center with the sample table 2, which is an upper plane of this cylinder and constitutes a ceiling plane of the above-described space, has the substantially same, or larger diameter than a diameter of the insulating film 1 corresponding to the sample mounting plane of the sample table 2, and this substantially circular plane is located opposite to the sample mounting plane. Furthermore, a dispersing plate 43 which corresponds to a substantially disk-shaped member and is stored in the cylindrical space is arranged under this cylindrical space. Also, the dispersing plate 43 is arranged in such a manner that a center of this dispersing plate 43 is located at the center of either the sample table 2 or the cylindrical space.

A diffusing space 17 is arranged on the center side within the dispersing plate 43. The diffusing space 17 corresponds to the above-described first space which is communicated with the coolant conducting entrance port 12 and is elongated along the plane direction of the sample 7, while the diffusing space 17 diffuses the coolant entered thereinto along the plane direction of the sample 7. This diffusing space 17 constitutes such a space which is formed between the diffusing plate 43 and the member which constitutes the lower plane of the sample table 2. The coolant entered into this diffusing space 17 and diffused therein is entered into a second space. The second space is formed between the upper plane of the diffusing plate 43 and the upper plane of the cylindrical space within the sample table 2 through a plurality of coolant conducting holes 18. The plural coolant conducting holes 18 are communicated with the upper plane of the substantially disk-shaped dispersing plate 43 and the dispersing plate 43, and penetrate through this dispersing plate 43.

In this case, the coolant is dispersed in the diffusing space 17 corresponding to the first space, and thereafter, the dispersed coolant is entered from the plural coolant conducting holes 18 into the second space, while the plural coolant conducting holes 18 are substantially symmetrically and uniformly arranged around the center axis, or along the radial direction on an upper portion of the dispersing plate 43. The upper plane of the second space corresponds to a substantially circular ceiling plane which is located opposite to either the sample 7 or the sample mounting plane. This upper plane of the second space constitutes the sample table 2 between the insulating film 1 constructing the sample mounting plane and the second space, and corresponds to a lower plane of a substantially disk-shaped member which is thermally connected via the sample mounting plane to the sample 7.

The coolant is sprouted from the coolant conducting holes 18 to be sprayed toward this ceiling plane. As a result, a portion of the coolant which collides with is dispersed along the plane direction of the sample 7, and also, is heat-exchanged with the member of the sample table 2 which constitutes this ceiling plane to be vaporized. As a result, the heat of the sample table 2 and the heat of the sample 7 on the sample monitoring plane is absorbed to be cooled. In other words, the above-explained second space constitutes a dispersing space 19 by which the coolant is sprayed to the plane located opposite to the sample 7 within the sample table 2 and then is dispersed. This dispersing space 19 has such a structure that the dispersing space 19 is sandwiched between the dispersing plate 43 and the upper member of the sample table 2 which constitutes the substantially circular ceiling plane, and corresponds to a cylindrical space whose height is low, while the coolants induced from the respective coolant conducting holes 18 are sprayed at a strong degree to the inner surface of the sample table 2 corresponding to the ceiling plane and directly collide with the inner surface.

The coolants containing such a coolant under vapor state which has been evaporated in the dispersing space 19 and whose heat has been removed are entered into an outer circumferential space 44 located on the outer circumferential side of the dispersing plate 43, while the outer circumferential space 44 corresponds to such an outer circumferential sided space of the dispersing space 19 of the cylindrical shaped space. This outer circumferential space 44 has a substantially ring-shaped space, and surrounds the cylindrical-shaped outer circumference of the dispersing plate 43. The coolant flown out from the dispersing space 19 is entered into this outer circumferential space 19 and is stored therein, and then, is exhausted from the coolant flow out port 1 communicated with this outer circumferential space 44 to an external portion of the sample table 2. The exhausted coolant is circulated within the refrigerating cycle coupled to the sample table 2, and is compressed by the compressor 14, and thereafter, the heat of the compressed coolant is cooled in the condenser 15, so that the heat is exhausted outside the refrigerating cycle. In this embodiment 1, the heat exchange is performed between the coolant and a pipe path of cooling water which is located parallel to the pipe path of the coolant within the condenser 15 so as to cool the coolant and condense the coolant.

Also, as shown in FIG. 2, while the coolants under fluid state flown from the coolant conducting entrance port 12 collides with the opposite plane of the sample mounting plane from the upper plane of the dispersing plate 43, after the coolants have been induced into the diffusing space 17, the induced coolants are uniformly spouted from the plural coolant conducting entrance ports 18 and collide with the plane positioned opposite to either the sample 7 or the sample mounting plane. As a result, the unequal cooling operation by the coolants under vapor state can be suppressed and the uniform temperature distribution of the sample 7 can be realized. In this embodiment 1, in order to improve the efficiency of the heat exchange, the member of the sample table 2 which constitutes the ceiling plane of the dispersing space 19 is made of a material having a high heat transfer characteristic such as aluminum, and has a substantially uniform thickness along the plane direction as to the radial direction of the ceiling plane, so that an uniform characteristic as to the heat transfer characteristic along the thickness (upper/lower) direction can be suppressed, and the uniform temperature distribution along the plane direction of the sample 7 can be improved.

In accordance with the embodiment 1, a heater 20 and a temperature sensor 21 are equipped inside the sample table 2 between the insulating film 1 and the plane where the coolant collides to be dispersed, while the heater 20 heats this sample table 2 and the temperature sensor 21 senses the temperature of the sample table 2. With employment of the above-described arrangement, a temperature control apparatus 22 calculates operation conditions of the refrigerating cycle by using the information of the temperature of either the sample table 2 or the sample 7 acquired from the detection result of the temperature sensor 21, and then, transmits operation instructions to these structural elements. The operation conditions of the refrigerating cycle are an output of the heater 20, a rotation number of the compressor 14, an open degree of the expansion valve 15, and the like. Since the above-explained operations are controlled, the temperature of the sample 7 can be continuously controlled in high precision.

As shown in FIG. 1, an actuator 110 is provided under the sample table 2 of this embodiment 1, and this actuator 110 can be moved along the upper/lower direction with respect to the vacuum vessel 4, so that height positions of both the sample table 2 and the sample mounting plan can be displaced along the upper/lower direction. As a consequence, a bellows is equipped to both the lower plane of the sample table 2 and the vacuum vessel 4 and the bellows can be expanded/compressed along the upper/lower direction between these structural members, so that the bellows can segment the space within the processing chamber from such a space that the coolant conducting entrance port 12, the coolant flow out port 13, the actuator 110, and the like are arranged under the sample table 2. In this embodiment 1, while the lower plane of the sample table 2 is installed from a wall plane inside the vacuum chamber 4 by making a space, an expandable/compressable bellows is arranged also between the vacuum vessel and the conducting path 11 for helium gas.

It should also be noted that in the embodiment 1 shown in FIG. 1 and FIG. 2, the frequency of the high frequency electric power of 4 MHz has been employed which is applied to the sample table 2. However, even in such a case that such high frequency electric power having other frequency bands from 800 KHz to 60 MHz is applied to the sample table 2, similar operations and effects may be achieved.

Also, the above-explained example of this embodiment 1 may especially become effective under such a condition that the high frequency electric power higher than, or equal to 3 W/cm$^2$ per unit area is applied to the sample 7, and can be effectively applied to an etching process operation for an insulating material which contains $SiO_2$, SiOC, SiOCH, $Si_3N_4$, SiC, and $Al_2O_3$ as the main component, which require the application of the high frequency high electric power. More specifically, in an HARC (High Aspect Ratio Contact) etching process operation in which a deep hole and a deep groove having a high aspect ratio are formed in an $SiO_2$ film (otherwise, SiOC and SiOCH causes are available), a high-speed processing operation is required, while the high aspect ratio is larger than, or equal to 15. As a consequence, in particular, high electric power having high frequencies must be applied to the sample 7 to be processed. Since the present invention is applied when the deep hole having such a high aspect ratio is formed, the uniform temperature control operation can be carried out in the high precision, and thus, the high-speed processing operation and the processing precision can be improved.

Embodiment 2

Figure 3:
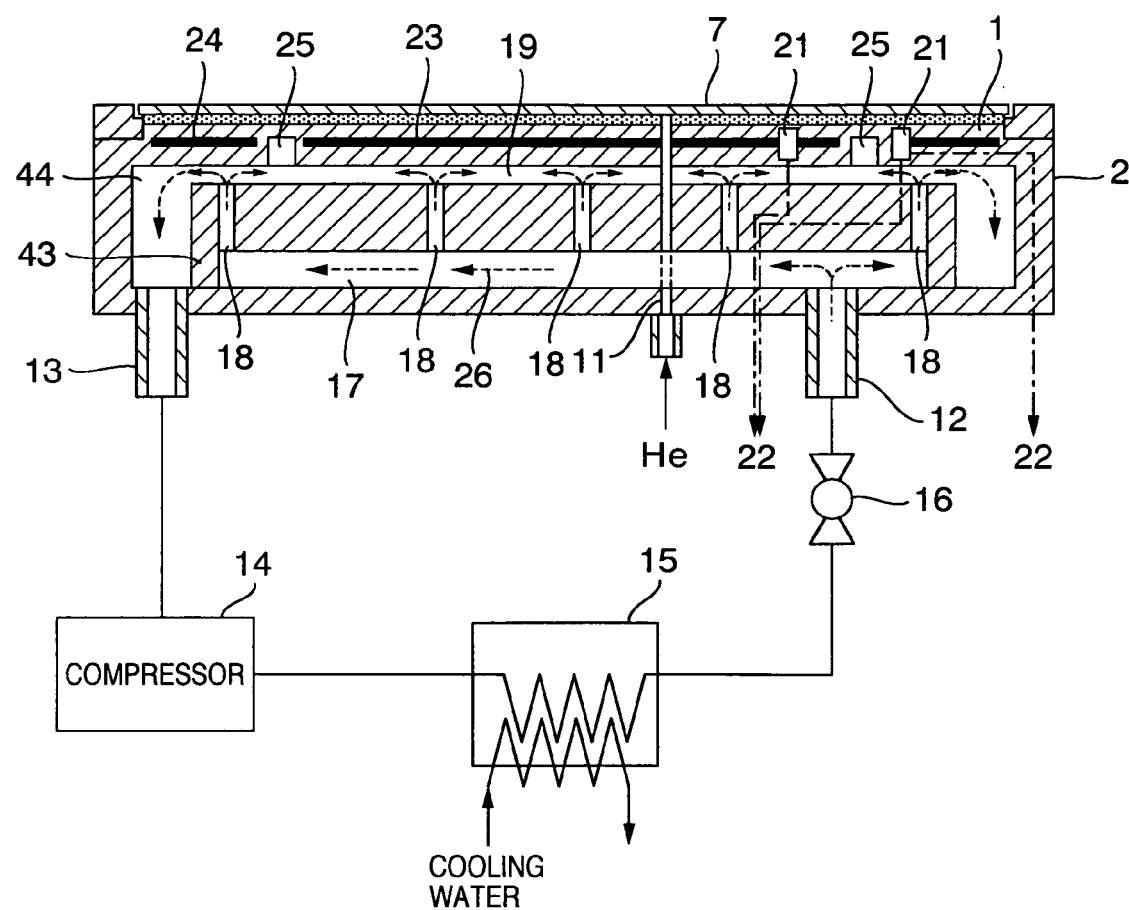
FIG. 3 is a longitudinal sectional view for representing a construction of a sample table of a plasma processing apparatus according to another embodiment different from the embodiment shown in FIG. 1.

FIG. 3 shows another embodiment 2 of the present invention. FIG. 3 is a longitudinal sectional view for schematically indicating a construction of a sample table according to the embodiment 2 which is different from the embodiment of the plasma processing apparatus shown in FIG. 1. It should be understood that the same reference numerals indicated in FIG. 1 and FIG. 2 will be employed as those for denoting the same, or similar structural elements in the embodiment of FIG. 3.

In this embodiment 2, heaters corresponding to the heating unit of the sample 7 arranged in the sample table 2 are arranged with respect to each of regions on the center side and the outer circumferential side of the sample 7 with respect to the construction shown in FIG. 2, and these heaters are independently controlled by the control apparatus 22. In the embodiment 2, these heaters are an inner-sided heater 23 disposed on the inner side of the sample and a ring-shaped outer-sided heater 24 provided on the outer circumferential side of the inner-sided heater 23. The inner-sided heater 23 is arranged in a substantially circular region involving the center of the sample table 2. These heaters 23 and 24 are arranged in an inner region of the sample table 2 between the upper plane of the dispersing space 19 and the insulating film 1 corresponding to the sample mounting plane. Also, the temperature sensors 21 are installed in the respective regions.

In the embodiment 2 of FIG. 3, outputs from the inner-sided heater 23 and the outer-sided heater 24 are independently controlled based upon sensor detection results made from the temperature sensors 21 arranged in correspondence with the respective heaters 23 and 24, so that a temperature distribution within the plane of the sample 7 can be arbitrarily controlled in a coaxial manner. since the arrangement capable of controlling this temperature distribution is employed, the un-uniformity of the etching shape as to the plane direction of the sample 7 can be suppressed and the etching shape can be processed in high precision.

Furthermore, in this embodiment 2, a ring-shaped slit 25 is formed in a portion between the inner-sided heater 23 of the sample table 2 and the outer-sided heater 24 thereof, while the ring-shaped slit 25 is used to suppress a heat transfer between the regions of the sample table 2 where these heater 23 and 24 are arranged. This slit 25 is made by forming a groove along a height direction of the sample table 2, and may suppress the heat transfer by reducing the thickness of the member of the sample table 2 along the height direction between the insulating film 1 and the dispersing space 19. With employment of this construction, temperature controlling characteristics as to the region on the center side of the sample 7 and the region on the outer side thereof may be increased.

In the embodiment 2 of FIG. 3, the heating unit and the temperature measuring unit have been arranged in the two regions respectively. Similarly, the heating unit and the temperature measuring unit are arranged in 3, or more independent regions, so that a temperature distribution within the plane of the sample 7 may be controlled in a more precise manner.

Embodiment 3

Figure 4A:
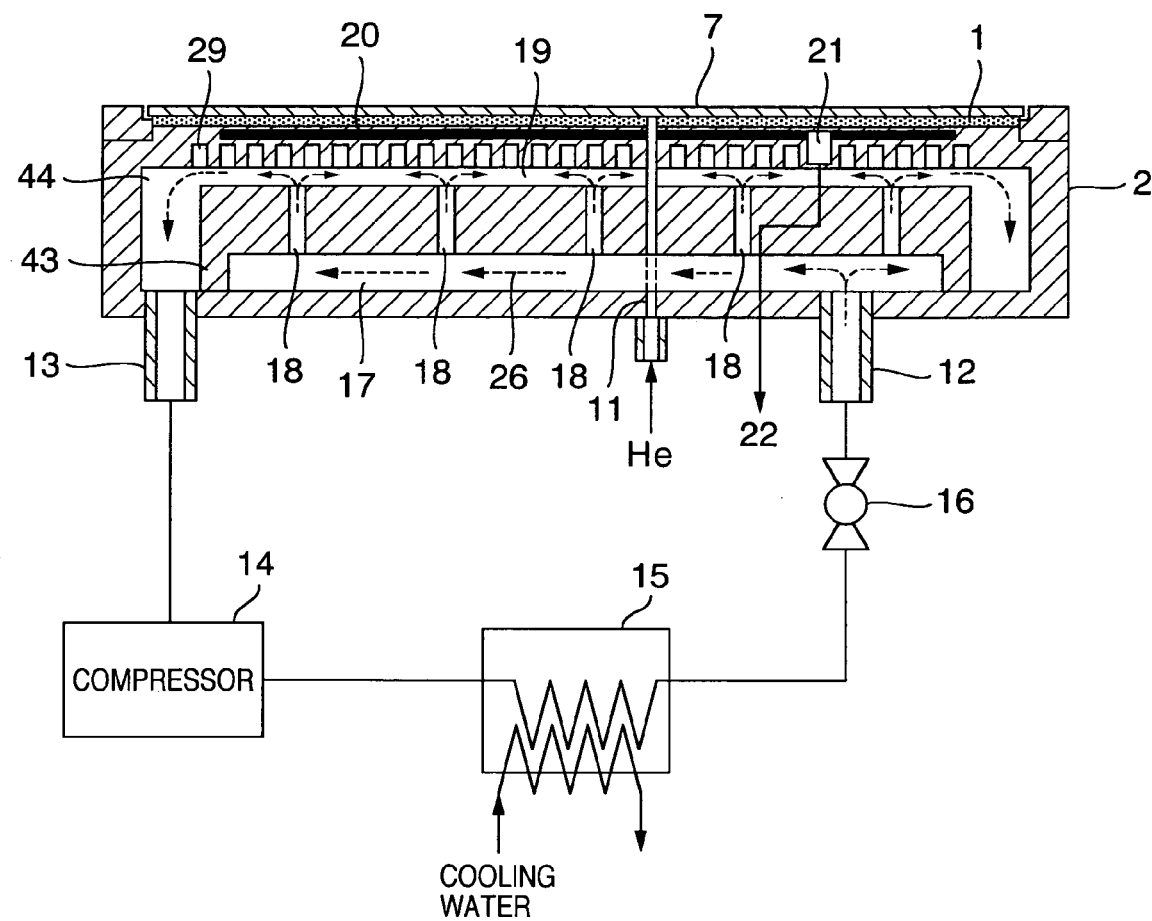
FIG. 4A is a longitudinal sectional view for indicating schematic constructions of a plasma processing apparatus according to another embodiment of the present invention.
Figure 4B:
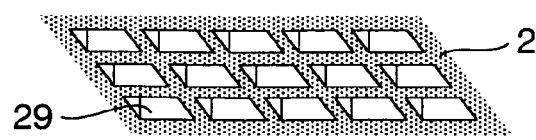
FIG. 4B is a diagram showing a sample table and cooling grooves provided therein in FIG. 4A.

FIG. 4A and FIG. 4B indicate another embodiment 3 of the present invention. FIG. 4A and FIG. 4B are longitudinal sectional views for schematically indicating a construction of a sample table according to the embodiment 3 of the present invention.

As shown in FIG. 4A, the embodiment 3 shown in FIG. 4A and FIG. 4B is arranged by that a plurality of cooling grooves 29 are owned by a surface of a member of the sample table 2 which constitutes the ceiling plane of the dispersing space 19 corresponding to the second space within the sample table 2. In this embodiment 3, at least one position of the plural coolant conducting holes 18 is arranged in such manner that coolants which are spouted out from the diffusing space 17 via the plural coolant conducting entrance ports 18 of the dispersing plate 43 to the dispersing space 19 directly collide with the inside surfaces of concaves of the upper cooling grooves 29 so as to be dispersed.

A preferred embodiment is constituted by providing the cooling grooves 29 arranged in such a manner that an inside of a concave is positioned above an opening in correspondence with the opening of each of the coolant conducting entrance holes 18. Further, as shown in FIG. 4B, a large number of cooling grooves 29 are arranged among these cooling grooves 29, and the cooling grooves 29 are provided over the entire region of the ceiling place of the dispersing space 19 located opposite to the sample mounting plane. It should also be understood that in this embodiment 3 shown in FIG. 4B, while each of the cooling grooves 29 is equipped with a substantially grid-shaped concave portion, these coolant grooves 29 are arranged in such a manner that the respective edges of the adjoining grids are located substantially parallel to each other, so that these edges of the grid are arranged so as to constitute either rows or columns as to two specific directions of the ceiling plane of the dispersing space 19.

The above-explained cooling grooves 29 are arranged above the space of the sample table 2, so that the cooling area within the sample table 2 can be increased by which this coolant collides to produce the heat exchange, and the cooling efficiency by the coolant can be improved. Also, since such cooling grooves 29 are formed, the thickness of the member of the sample table 2 between the sample mounting plane and the diffusing space 19 corresponding to the second space can be effectively made thin, while lowering of the structural strength is suppressed, and thus, a thermal capacity can be suppressed to small thermal capacity. Since this thermal capacity is lowered, the sample temperature can be controlled in correspondence with a change in the coolant temperatures in a high speed.

Embodiment 4

Figure 5A:
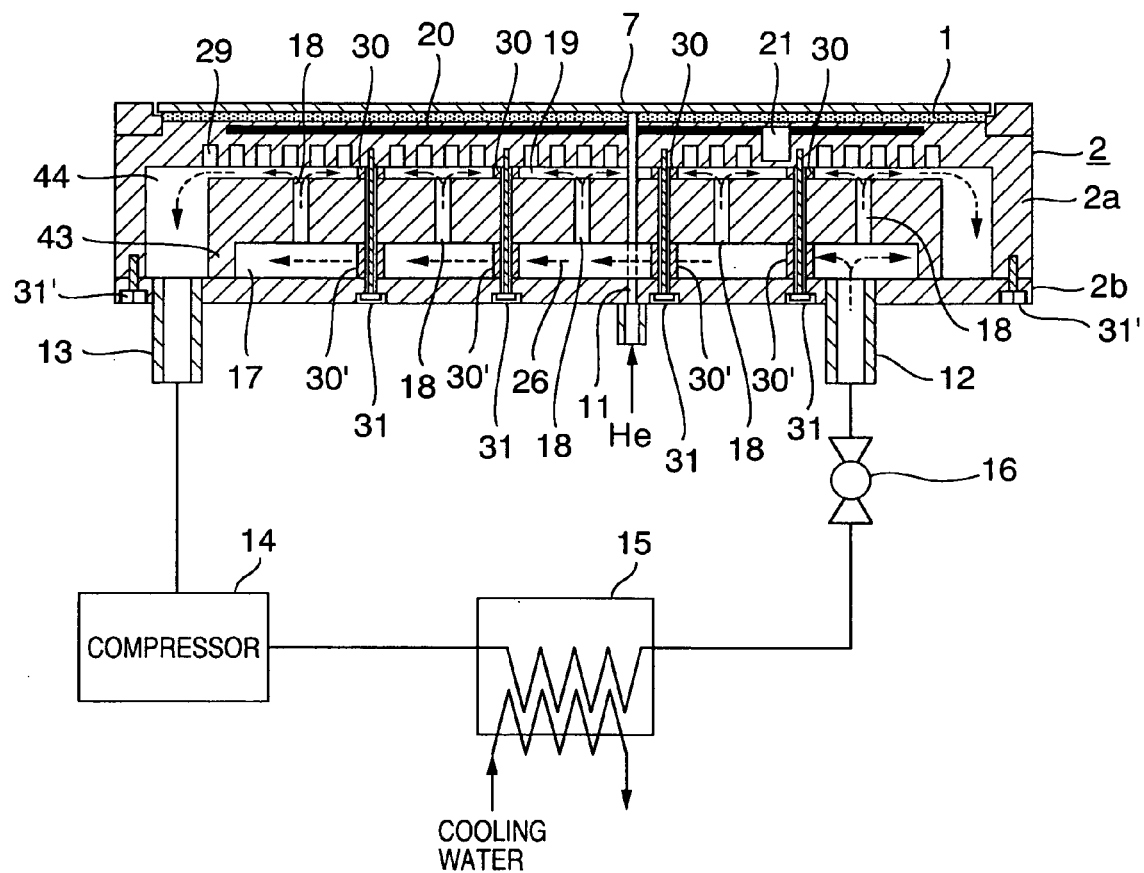
FIG. 5A is a longitudinal sectional view for indicating schematic constructions of a plasma processing apparatus according to another embodiment of the present invention.
Figure 5B:
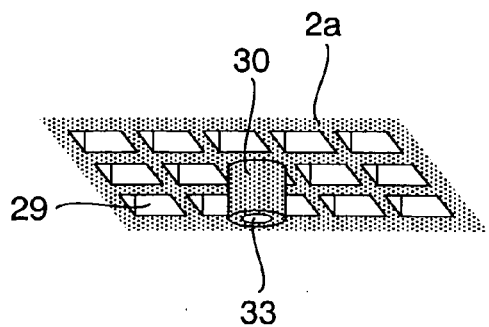
FIG. 5B is a diagram showing a sample table, cooling grooves and a bolt hole provided therein in FIG. 5A.

FIG. 5A and FIG. 5B indicate another embodiment 4 of the present invention. FIG. 5A and FIG. 5B are longitudinal sectional views for schematically indicating a construction of a sample table according to the embodiment 4 of the present invention.

The embodiment 4 of FIG. 5A and FIG. 5B is featured as follows: That is, while the sample table 2 of the above-explained embodiment 3 shown in FIG. 4A and FIG. B is subdivided into an upper member 2a and a lower member 2b, both the upper member 2a and the lower member 2b are fastened by a plurality of fixing beams 30 and a plurality of beam fixing bolts 31. The plural fixing beams 30 are arranged within the dispersing space 19 on the upper plane of the dispersing plate 43. The plural beam fixing bolts 31 are arranged in such a way that these beam fixing bolts 31 penetrate through the insides of these fixing beams 30.

In the arrangement of the present invention equipped with a structure in which the coolants are evaporated within the dispersing space 19, since such a structure for cooling the upper member 2a (in particular, member between dispersing space 19 and sample mounting plane) of the sample table 2 is made by expansion caused by the vaporization of these coolants, inner pressure of the dispersion space 19 becomes approximately 5 to 20 atm. As a consequence, the sample table 2 must have such a strength capable of maintaining a deformation of the sample mounting plane and seals provided inside and outside the sample table 2 with respect to this pressure.

In this embodiment 4, as shown in FIG. 5A, the below-mentioned arrangement is employed. That is, the upper member 2a is fastened to the lower member 2b by the fixing beams 30 and 30', and the beam fixing bolts 31 which penetrate through the dispersing space 19, the dispersing plate 4, and furthermore, the diffusing space 17 located below these members 19 and 4, and these members are coupled to each other. Since such a structure is employed, the structural strength of the sample table 2 is increased.

In this embodiment 4, as represented in FIG. 5B, while the cooling grooves 29 shown in the embodiment 3 of FIG. 4A and FIG. 4B are disposed in the surface of the upper member 2a corresponding to the upper plane of the dispersing space 19, the circumference thereof is surrounded by these cooling grooves 29 and the fixing beam 30 is arranged, and a bolt hole 33 for a fixing beam formed in the inner side thereof is provided. Also, the fixing bolt 31 is positioned on a substantially coaxial circumference on the center side and the outer circumferential side of the sample table 2, and is fitted from the lower portion of the lower member 2b to the upper portion thereof. As a result, the respective fixing bolts 31 provided on the center side and the outer circumferential side penetrate through the lower member 2b, the fixing beam 30, the bolt hole 33, and the dispersing plate 43, and then, are screwed into the upper member 2a provided above the dispersing space 19.

Furthermore, the upper member 2a and the lower member 2b are fastened to each other by the outer circumferential-sided fixing bolt 31' in such a way that the outer circumferential-sided edge portions of the sample table 2 abut against each other, and the upper member 2a and the lower member 2b sandwich a seal member (not shown) arranged between these edge portions of the outer circumferential sides. As explained above, the diffusing spaces 17 inside and outside of the dispersing plate 43, the internal portion of the dispersing space 19, and the outer portion of the sample table 2 may be sealed in a tight degree.

With employment of such an arrangement, in accordance with this embodiment 4, while lowering of the strength of the sample table 2 is suppressed, either lowering of the heat capacity thereof or increasing of the thermal contact area of the coolant can be realized.

Embodiment 5

Figure 6A:
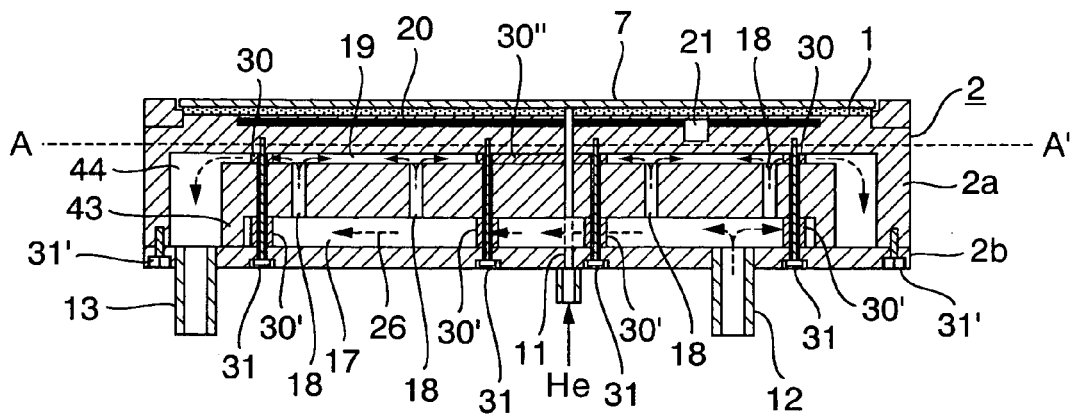
FIG. 6A is a longitudinal sectional view indicating the schematic construction of a plasma processing apparatus according to another embodiment of the present invention.
Figure 6B:
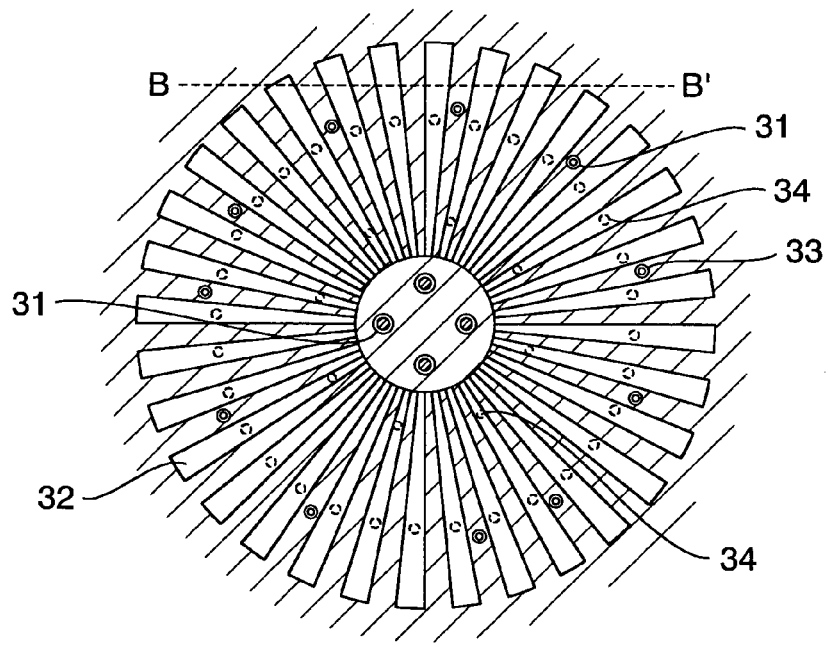
FIG. 6B is a plane sectional view of the plasma processing apparatus cut along a line A-A' in FIG. 6A.
Figure 6C:
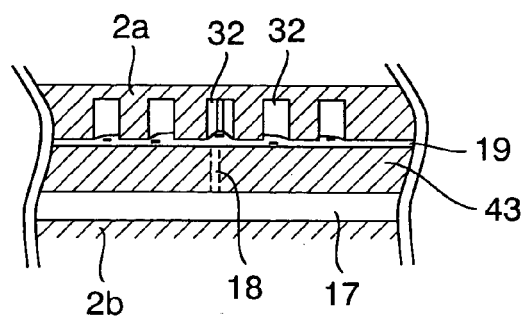
FIG. 6C is a sectional view of the plasma processing apparatus cut along a line B-B' in FIG. 6B.

FIG. 6A and FIG. 6B indicate another embodiment 5 of the present invention. FIG. 6A and FIG. 6C are an upper view for longitudinal sectional views for schematically indicating a construction of a sample table according to the embodiment 5 of the present invention.

In the embodiment 5 shown in FIG. 6A to FIG. 6C, instead of the cooling grooves 29 arranged in the upper member of the sample table 2 shown in FIG. 4A and FIG. 4B, or FIG. 5A and FIG. 5B, a plurality of radial-shaped cooling grooves 32 are arranged in the ceiling plane of the dispersing space 19, while these radial-shaped cooling grooves 32 are elongated from the center of the sample table 2 to the outer circumferential side thereof. Other arrangements of this embodiment 5 are equal to those of the embodiment 4 shown in FIG. 5A and FIG. 5B, while both a fixing beam 30 and a fixing bolt 31 are involved, as shown in FIG. 6A.

In the embodiment 5, opening positions of the coolant conducting holes 18 arranged in the upper plane of the dispersing plate 43 are arranged below the concave portions of the radial-shaped cooling grooves 32. In other words, as represented in FIG. 6B and FIG. 6C, as viewed from the upper direction, openings 34 of the coolant conducting holes are arranged at such positions which are covered by the concave portions of the respective grooves of the plural radial-shaped cooling grooves formed on the coaxial-shaped circumferences on the center side and the outer circumferential side while the sample table 2 is set as the center. These openings 34 are arranged at such positions which are symmetrically arranged at the center on the substantially circumferential line on the plural radial positions of the radial direction while the sample table 2 is located at the center, and are constituted in such a way that the coolants are uniformly supplied along the radial direction and the circumferential direction.

It should also be noted that in this embodiment 5, both the fixing beams 30 and the fixing bolts 31 are arranged on such convex portions which are projected on the side of the dispersing plates 43 among the concaves of the radial-shaped cooling grooves 32. Furthermore, disk-shaped fixing beams 30" which are substantially coaxial with respect to the center are arranged at the center portion of the sample table 2, while a plurality of bolt holes 33 are formed in the fixing beams 30".

With employment of this structure, the coolants which are spouted out from the diffusing space 17 via the coolant conducting holes 18 collide with the inner surfaces of the concaves of the respective radial-shaped cooling grooves 32 formed in the upper member 2a of the sample table 2 which constitutes the upper plane of the dispersing space 19, and the coolants perform the heat-exchange with this upper member 2a. As a result, although the coolants which have been evaporated to be vapored, if the heat-exchanged coolants are piled up on the surface of the upper member 2a, then these heat-exchanged coolants may impede the heat-exchange of other coolants under fluid state, and thus, the efficiency of the heat exchange is lowered, so that the coolants after the heat exchange must be exhausted to the coolant flow out port 13 formed on the outer circumferential side of the sample table 2.

In this embodiment 5, as represented in FIG. 6B, the radial-shaped cooling grooves 32 are provided in the lower plane which is faced with the dispersing space 19 of the upper member 2a of the sample table 2, and a coolant transporting path is provided in the upper portion of the dispersing space 19. The coolant transporting path is reached from the center side to the outer circumferential side of the dispersing plate 43. Each of the radial-shaped coolant grooves 32 is elongated from the outer circumferential end of the fixing beam 30 up to an upper space of an outer circumferential space 44 on the outer side of the dispersing plate 43, while the disk-shaped fixing bolt 31 arranged on the center side of the sample table 2 penetrates through the fixing beam 30. Also, a width of each of the radial-shaped cooling grooves 32 along the circumferential direction is gradually increased from the center side toward the outer circumferential side, namely, has a fan shape of a sectional view.

While the coolants which have been spouted from the coolant conducting holes 18 into the dispersing space 19 are contacted with the upper member 2a with the concave of the radial-shaped cooling grooves 32 in a high efficiency so as to perform heat-exchange with the upper member, the coolants can be transported in a high efficiency along the radial direction of the sample table 2 of the radial-shaped concave portions which are elongated from the center side up to the outer circumferential side of the dispersing plate 43. As a consequence, pile-up conditions of the coolant at the upper portion of the dispersing space 19 can be suppressed, and the coolants under fluid state can be continuously contacted to the sample table 2, so that the cooling efficiency by the coolants can be improved. Similar to the embodiment 3 of FIG. 4A and FIG. 4B, and the embodiment 4 of FIG. 5A and FIG. 5B, even in the radial-shaped cooling grooves 32 of FIG. 6A to FIG. 6C, while the heat capacity of the upper member 2a of the sample table 2 can be lowered, the contact area of the coolants can be increased, and furthermore, lowering of the mechanical strength as to the sample table 2 can be suppressed.

Embodiment 6

Figure 7A:
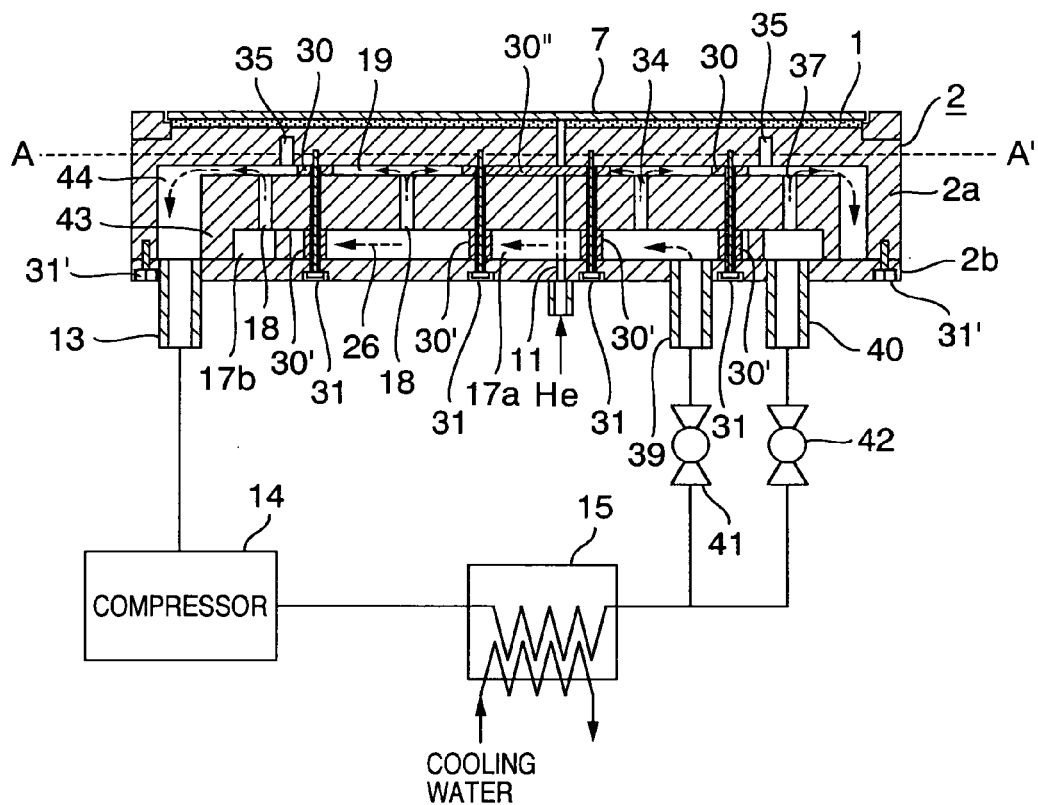
FIG. 7A is a longitudinal sectional view for indicating schematic constructions of a plasma processing apparatus according to another embodiment of the present invention.
Figure 7B:
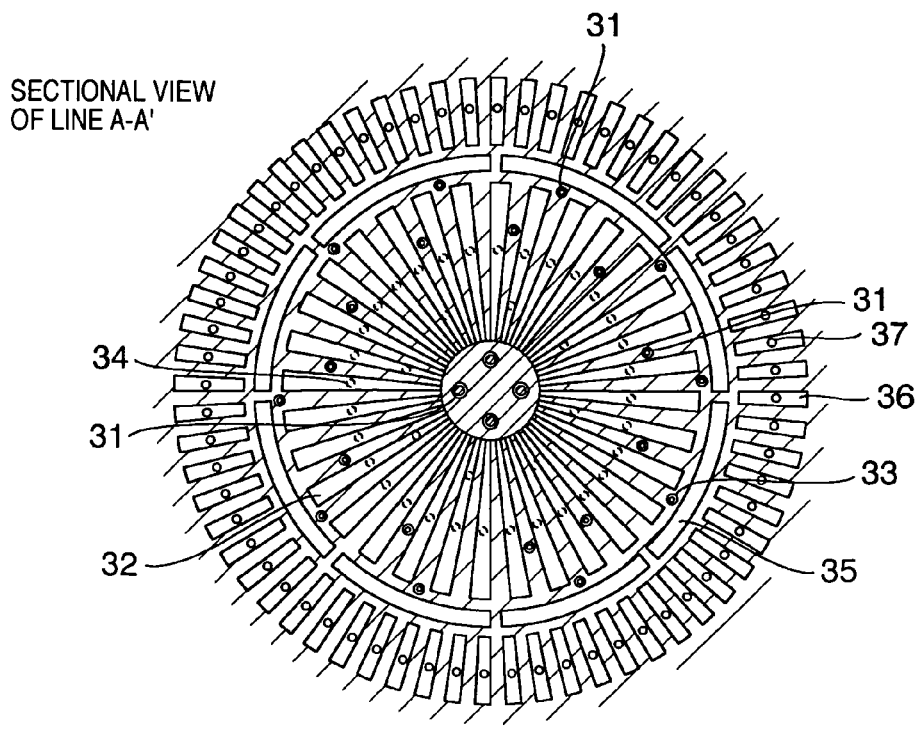
FIG. 7B is a plane sectional view of the plasma processing apparatus cut along a line A-A' in FIG. 7A.

FIG. 7A and FIG. 7B indicate another embodiment 6 of the present invention. FIG. 7A and FIG. 7B are longitudinal sectional views for schematically indicating a construction of a sample table according to the embodiment 6 of the present invention.

Similar to the embodiment 5 of FIG. 6A to FIG. 6C, the embodiment 6 of FIG. 7A and FIG. 7B is featured by including radial-shaped cooling grooves 32 in either a substantially circular-shaped region or a ring-shaped region, which are faced to the dispersing space 19 of the upper member 2a of the sample table 2. Furthermore, a plurality of radial-shaped cooling grooves 36 are provided in a lower surface of the sample table 2 of a substantially ring-shaped region located on the outer circumferential side of the radial-shaped cooling grooves 32. In other words, in this embodiment 6, the transport paths of the coolants are arranged in a coaxial manner and in a dual manner. Also, a slit 35 corresponding to a ring-shaped groove is arranged between the coolant grooves of the region on the center side and the coolant grooves of the region on the outer circumferential side. The slit 35 is constructed in such a manner that the heat transfer between both members can be suppressed in order that the heat transfer in these regions along the upper/lower direction is increased.

As indicated in FIG. 7A and FIG. 7B, the radial-shaped cooling grooves 32 and 36 formed in the region on the center side and the region on the outer circumferential side are arranged in such a manner that the concave portions thereof are arranged along the radial direction from the center of the sample table 2, and have such fan-shaped concave shapes that widths of circumferential direction are increase along the outer circumferential side of the sample table 2 from the center side thereof. Also, as viewed from the upper direction of the sample table 2, both openings 34 on the center side of the coolant conducting holes 18 and openings 37 on the outer circumferential side thereof formed in the upper plane of the dispersing plate 43 are arranged at such positions which are covered by the concave portions. These openings 34 and 37 are arranged at such positions which constitute symmetrical positions on a substantially circumferential line as a center at a plurality of radial positions of the radial direction as to the center of the sample table 2, and are constructed in order that the coolants may be uniformly supplied along the radial direction and the circumferential direction.

Moreover, the coolants spouted from the coolant conducting holes 18 directly collide into the concaves of the respective radial-shaped coolant grooves 32 and 36 so as to be heat-exchanged with the upper member 2a of the sample table 2. In addition, the radial-shaped cooling grooves 36 on the outer circumferential side are elongated from a center sided edge portion above the dispersing plate 43 up to the upper space of the outer circumferential space 44 which is located on the outer circumferential side from the outer circumferential edge portion of the dispersing plate 43, so that the coolants are more smoothly transported from the center side of the sample table 2 up to the outer circumferential space 44 on the outer circumferential side, piling up of the coolants in the upper space of the dispersing space 29 are suppressed, and thus, the heat exchange efficiency within the sample table 2 is improved. In the region on the outer circumferential side of the dispersing space 19, the coolants from the region on the center side are merged with each other and are mixed with each other, and the mixed coolants are heat-exchanged in the region of the outer side, and the heat-exchanged coolants are entered from the upper space of the outer circumferential space 44 outside the dispersing plate 43 in combination with the vaporized coolants. Thereafter, the entered coolants are exhausted from the coolant flow output 13 outside the sample table 2, and then, the exhausted coolants are entered into the compressor 14.

Also, while the diffusing space 17 has been partitioned by a ring-shaped partition 38 so as to be subdivided into a space on the center side and a ring-shaped space on the outer circumferential side thereof, the ring-shaped partition 38 is arranged between the center-sided space and the ring-shaped space. Coolant conducting entrance ports 39 and 40 into which coolants flow are connected to the center-sided space and the ring-shaped space respectively. Furthermore, expansion valves 40 and 41 whose operations are independently controlled by a temperature control apparatus 22 (not shown) respectively are coupled to the coolant conducting entrance ports 39 and 40, so that the coolants whose pressure has been controlled by these expansion valves 39 and 40 are induced to these respective spaces.

In the refrigerating cycle shown in the present invention, the temperatures of the coolants induced by the pressure-controlled coolant by the above-explained expansion valves 40 and 41 can be controlled. As a result, the coolant whose temperature has been independently controlled by the coolant conducting entrance port 39 and the expansion valve 41 corresponding thereto, and also the coolant whose temperature has been independently controlled by the coolant conducting entrance port 40, and the expansion valve 42 corresponding thereto are supplied to the radial-shaped cooling grooves 32 on the center side, and also, the radial-shaped cooling grooves 36 on the outer circumferential side, respectively. Also, a region of the upper surface on the center side of the dispersing space 19 of the upper member 2a, and another region of the outer surface on the outer circumferential side thereof where the radial-shaped cooling grooves 32 and 36 are arranged are segmented by a heat insulating layer 35. As a result, the temperature of the center portion of the sample 7 and the temperature of the outer circumferential portion thereof can be controlled to be different from each, and a distribution of this temperature can be freely set.

Also, in accordance with this embodiment 6, the temperature distribution within the plane of the sample 7 can be properly controlled without using the heaters 23 and 24 indicated in the embodiment 2 of FIG. 3A and FIG. 3B. To the contrary, as apparent from the foregoing description, if the heaters 23 and 24 shown in FIG. 3A and FIG. 3B are employed in combination with the sample table 2 of this embodiment 6, then a temperature distribution may be controlled over a wider range.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus, equipped with a vacuum vessel and a sample table which is arranged within a processing chamber disposed inside said vacuum vessel and has a sample mounting plane on which a sample having a substrate shape is mounted, for generating plasma within said processing chamber so as to process a sample mounted on said sample mounting plane wherein said sample table includes an internal structure for performing a refrigerating cycle and in which coolant is circulated, the sample table being configured as an evaporator inside of which the coolant is evaporated to adjust a temperature of the sample table, the plasma processing apparatus further comprising:

a plate member which is arranged inside said sample table and is provided on an upper surface thereof with a plurality of coolant conducting holes;

a first space which is disposed within said sample table, the coolant being supplied into an inside of the first space being diffused along a plane direction of said sample and flowing out from the first space;

a second space which is arranged above said plate member within said sample table, the second space including a lower height space disposed between an upper surface of the plate member and a ceiling plane of the second space arranged opposite to said sample mounting plane and a ring-shaped space disposed on an outer circumferential side of the plate member which corresponds to an outer circumferential sided space of the second space, the coolant conducting holes being disposed from the first space below the upper surface of the plate member toward the ceiling plane; and an exhaust port of the coolant arranged on a lower side of the ring-shaped space and below the upper surface of the plate member and connected to an outside of the sample table.

2. A plasma processing apparatus as claimed in claim 1, further comprising:

a plurality of concave portions which are arranged in said ceiling plane and into which said coolant is induced.

3. A plasma processing apparatus as claimed in claim 2 wherein:

the coolants supplied into second space from said plurality of coolant conducting holes are directly induced into internal portions of said concave portions.

4. A plasma processing apparatus as claimed in claim 2 wherein:

said plurality of concave portions are constituted by a plurality of grooves which are elongated in a radial form from a center side of said sample table to an outer circumferential side thereof.

5. A plasma processing apparatus as claimed in claim 4 wherein:

said groove elongated in the radial form has such a shape that a width thereof on the outer circumferential side of said sample table is wider than a width thereof on the center side of the sample table, and said coolant supplied to said groove is moved from the center side of the said sample table toward the outer circumferential side.

6. A plasma processing apparatus as claimed in claim 1, further comprising:

a supply path for supplying heat transfer gas between said sample mounting plane and said sample mounted on said sample mounting plane.

* * * * *